(12) United States Patent
Junus et al.

(10) Patent No.: US 7,479,810 B2
(45) Date of Patent: Jan. 20, 2009

(54) SLEW-RATE DETECTION CIRCUIT USING SWITCHED-CAPACITOR COMPARATORS

(75) Inventors: Budiyanto Junus, Jakarta (ID); Luke A. Johnson, Queen Creek, AZ (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 11/731,710

(22) Filed: Mar. 30, 2007

(65) Prior Publication Data

US 2008/0238492 A1    Oct. 2, 2008

(51) Int. Cl.
   *H05K 5/00*    (2006.01)
(52) U.S. Cl. .................... 327/91; 327/97; 327/337; 327/554
(58) Field of Classification Search ............. 327/91–97, 327/336, 337, 554, 594
   See application file for complete search history.

(56) References Cited

U.S. PATENT DOCUMENTS

| | | | | |
|---|---|---|---|---|
| 4,352,069 A | * | 9/1982 | Dessoulavy | 327/337 |
| 4,746,871 A | * | 5/1988 | de la Plaza | 327/337 |
| 5,075,688 A | * | 12/1991 | Hosotani et al. | 341/122 |
| 5,821,780 A | * | 10/1998 | Hasegawa | 327/63 |
| 6,147,522 A | * | 11/2000 | Rhode et al. | 327/93 |

\* cited by examiner

*Primary Examiner*—An T Luu
(74) *Attorney, Agent, or Firm*—Ryder IP Law; Douglas J. Ryder

(57) ABSTRACT

In general, in one aspect, the disclosure describes an apparatus that includes a first switched capacitor comparator to be charged to a first reference voltage and to compare an input signal to the first reference voltage and to generate a first output signal when the input signal reaches the first reference voltage. A second switched capacitor comparator to be charged to a second reference voltage and to compare the input signal to the second reference voltage and to generate a second output signal when the input signal reaches the second reference voltage. Time between the first output signal and the second output signal is slew rate of the input signal.

15 Claims, 3 Drawing Sheets

SLEW-RATE DETECTION CIRCUIT USING SWITCHED-CAPACITOR COMPARATORS

BACKGROUND

The slew rate of an input signal can be determined by utilizing a comparator to compare the input signal to various thresholds and generating output signals when the thresholds are crossed. The time between the generation of the output signals is the slew rate of the input signal.

FIG. 1A illustrates an example input signal ($V_{IN}$) and the output signals generated based thereon. The input signal proceeds from ground to $V_{CC}$ over a period of time. When the input signal crosses over a first threshold (e.g., 20% $V_{CC}$) a first (low) output signal ($V_{OL}$) is generated and when the input signal crosses over a second threshold (e.g., 80% $V_{CC}$) a second (high) output signal ($V_{OH}$) is generated. The time ($\Delta t$) between the output signals is the slew rate of the input signal.

FIG. 1B illustrates an example slew rate detector 100. The detector 100 includes two operational amplifier comparators (op-amps) 110, 120. The first op-amp 110 compares the input signal to the high reference voltage (80% $V_{CC}$) and generates a high out signal when the input signal crosses over the high reference voltage. The second op-amp 120 compares the input signal to the low reference voltage (20% $V_{CC}$) and generates a low out signal when the input signal crosses over the low reference voltage. The time delay between two outputs ($\Delta t$) corresponds to the slew rate of the input signal.

The op-amps 110, 120 need to be matched for the detector 100 to work effectively. However, the op-amp 110 may utilize negative channel transistors (e.g., NMOS) and the op-amp 120 may utilize positive channel transistors (e.g., PMOS). Furthermore, the op-amps 110, 120 may be susceptible to process, voltage and temperature (PVT). Mismatches in the clock to output time ($T_{CO}$) of the op amps 110, 120 may cause an unacceptable detection error. As the incoming slew rate gets smaller as the speed of applications increase the tighter the detection parameters will be.

BRIEF DESCRIPTION OF THE DRAWINGS

The features and advantages of the various embodiments will become apparent from the following detailed description in which.

DETAILED DESCRIPTION

Figure 1A:
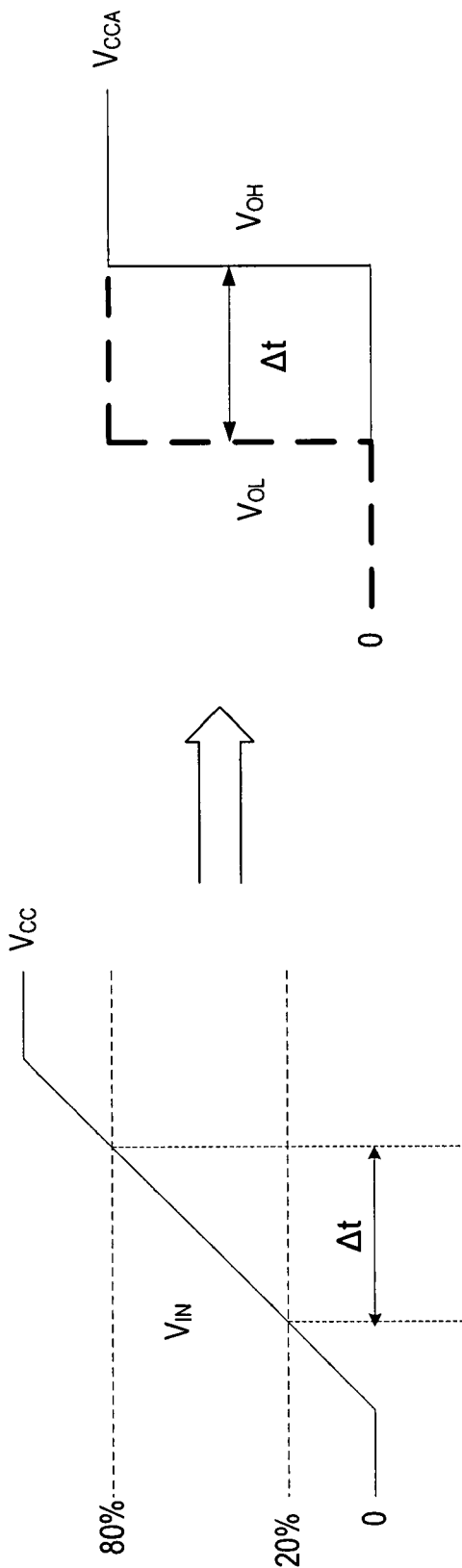
FIG. 1A illustrates an example input signal and the output signals generated based thereon, according top one embodiment.
Figure 1B:
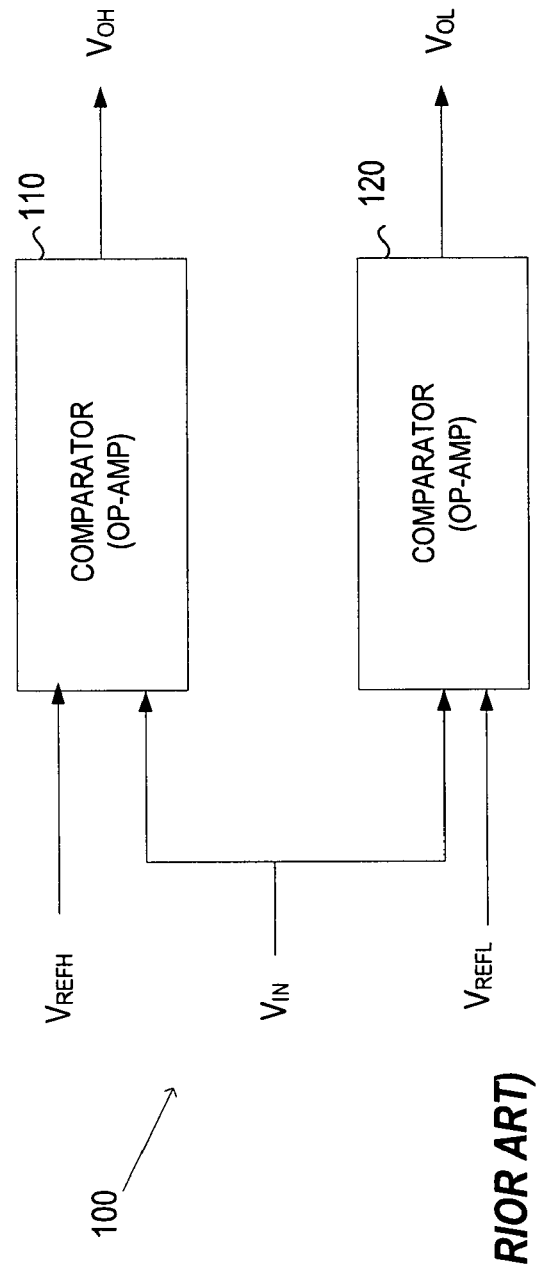
FIG. 1B illustrates an example slew rate detector using operational amplifier comparators, according to one embodiment.
Figure 2:
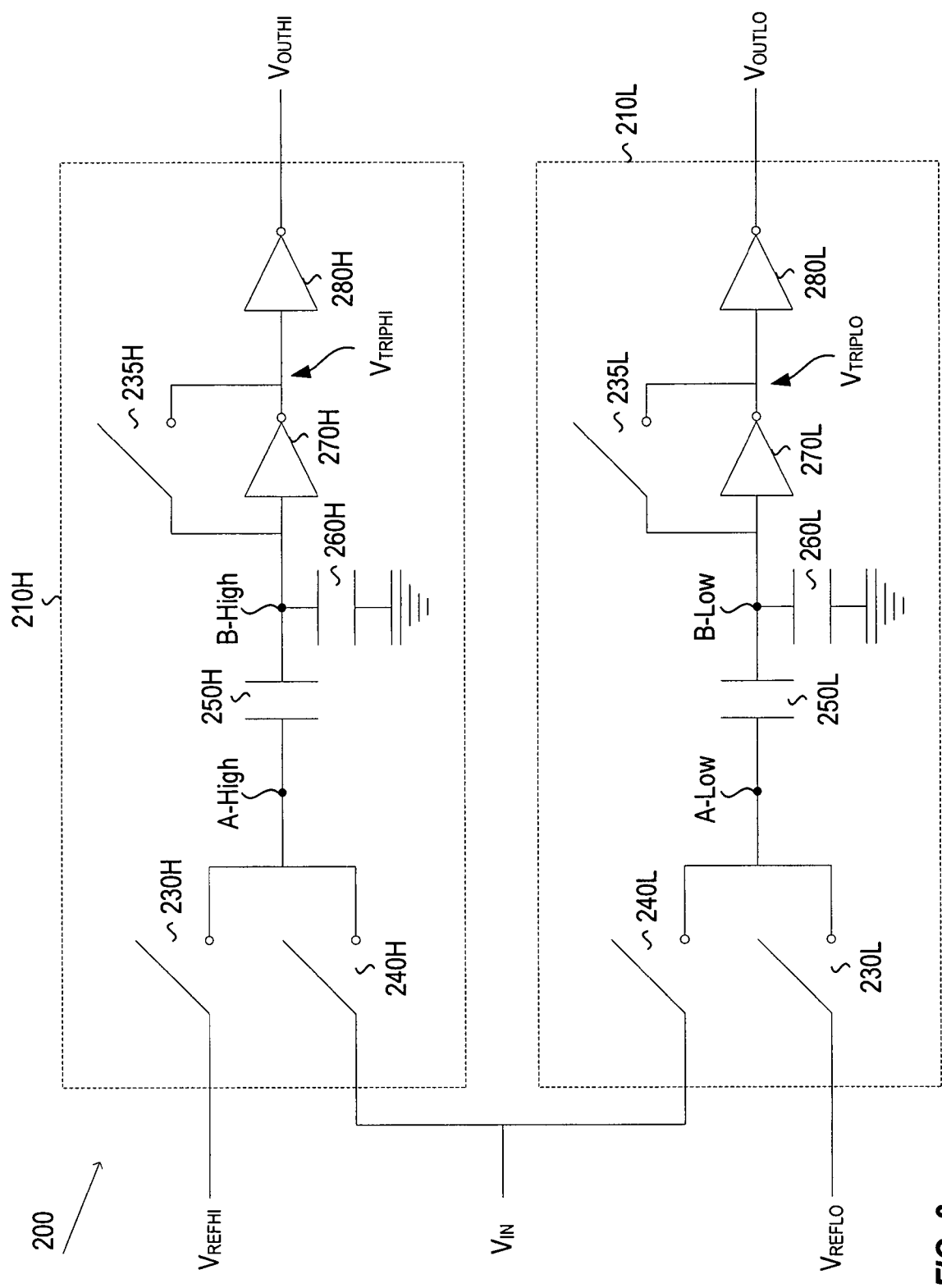
FIG. 2 illustrates an example slew rate detector comparator using capacitive comparators, according to one embodiment.

FIG. 2 illustrates an example slew rate detector comparator 200. The detector 200 includes two switched capacitor comparators 210H, 210L. The first comparator 210H compares the high reference voltage ($V_{REFHI}$) to the input voltage ($V_{IN}$) and activates/deactivates a high output voltage signal ($V_{OUTHI}$) when $V_{IN}$ crosses the $V_{REFHI}$ threshold depending on whether it is a rising or falling edge of $V_{IN}$. The second comparator 210L compares the low reference voltage ($V_{REFLO}$) to $V_{IN}$ and activates/deactivates a low output voltage signal ($V_{OUTLO}$) when $V_{IN}$ crosses the $V_{REFLO}$ threshold. The $\Delta t$ between $V_{OUTHI}$ and $V_{OUTLO}$ corresponds to the input signal slew rate in time-domain.

The comparators 210H, 210L are identical and include charge switches 230, 235, a compare switch 240, first and second capacitors 250, 260, and first and second inverters (inverting comparators) 270, 280. The comparators 210H, 210L receive two complementary clocks (charge and compare) that control the operation of the charge switches 230 and the compare switches 240 respectively.

When the charge clock is high (and the compare clock is low) the charge switches 230, 235 will be closed (and the compare switches 240 will be open) and the comparators 210H, 210L will be in a charging state. For the comparator 210H when the charge switch 230H is closed the capacitor 250H is connected to $V_{REFHI}$ and that side (node A-high) of the capacitor 250H is charged to $V_{REFHI}$ (80% of $V_{CC}$). When the charge switch 235H is closed an input and output of the first inverter 270H is shorted together (a negative feedback path is provided for the inverter 270H) so that the first and second capacitors 250H, 260H are coupled to the second inverter 280H. The sides of the capacitors coupled to the second inverter (node B-high) are equalized to the output of the first inverter 270H/input of the second inverter 280H (the trip-point of the second inverter 280H, $V_{TRIPHI}$). For the comparator 210L, node A-low is charged to $V_{REFLO}$ (20% of $V_{CC}$) and node B-low is charged to the second inverter 280L trip-point ($V_{TRIPLO}$).

When the compare clock is high (and the charge clock is low) the compare switches 240 will be closed (and the charge switches 230, 235 will be open) and the comparators 210H, 210L will be in a comparing state. For the comparators 210H, 210L when the compare switch 240 is closed the capacitor 250 is connected to $V_{IN}$. If $V_{IN}$ is on a rising edge $V_{IN}$ will reach $V_{REFLO}$ first so the operation of the second comparator 210L will be discussed first. From the charging state the capacitor 250L is storing $V_{REFLO}$ and $V_{TRIPLO}$. When $V_{IN}$ reaches $V_{REFLO}$ the inverters 270L, 280L will trip and the $V_{OUTLO}$ signal will go from low to high. For the comparator 210H from the charging state the capacitor 250H is storing $V_{REFHI}$ and $V_{TRIPHI}$. When $V_{IN}$ reaches $V_{REFHI}$ the inverters 270H, 280H will trip and the $V_{OUTHI}$ signal will be activated (go from low to high). The time difference between two trip points is $\Delta t$, which corresponds to the slew rate.

For a falling edge $V_{IN}$, the $V_{OUTHI}$ would be deactivated (go from high to low) first followed by the $V_{OUTLO}$ being deactivated.

Using switched capacitor comparators to detect the slew rate enables the comparators to have the same (substantially identical) design as well as operate with same (substantially identical) biasing conditions so systematic errors (e.g., PVT) are substantially eliminated. Furthermore, the negative feedback connection across the comparator during the charge state auto-zeros any random mismatch errors in the comparators. Although the two comparators are identically designed, manufacturing defects and lithographic variations result in slight random variations in the behavior of each. During the charge phase any such statistical errors in the zero-crossing threshold of the comparator get stored on the capacitor so that during the compare phase, this offset error is reduced by a factor of A+1; where A is the gain of the comparator. The statistical mismatch between the two comparators is substantially reduced (e.g., by at least 10 times). As a result of the substantially identical circuits, substantially identical biasing, and auto-zeroing of mismatch enabled, precision in slew rate detection is accomplished.

The switched capacitor slew-rate detector may be utilized in any number of input/output (I/O) systems. The high-precision of the switched capacitor slew-rate detector allows it to be used for high-speed systems. The switched capacitor slew-rate detector may be implemented in any number of integrated circuits utilized in these systems.

Figure 3:
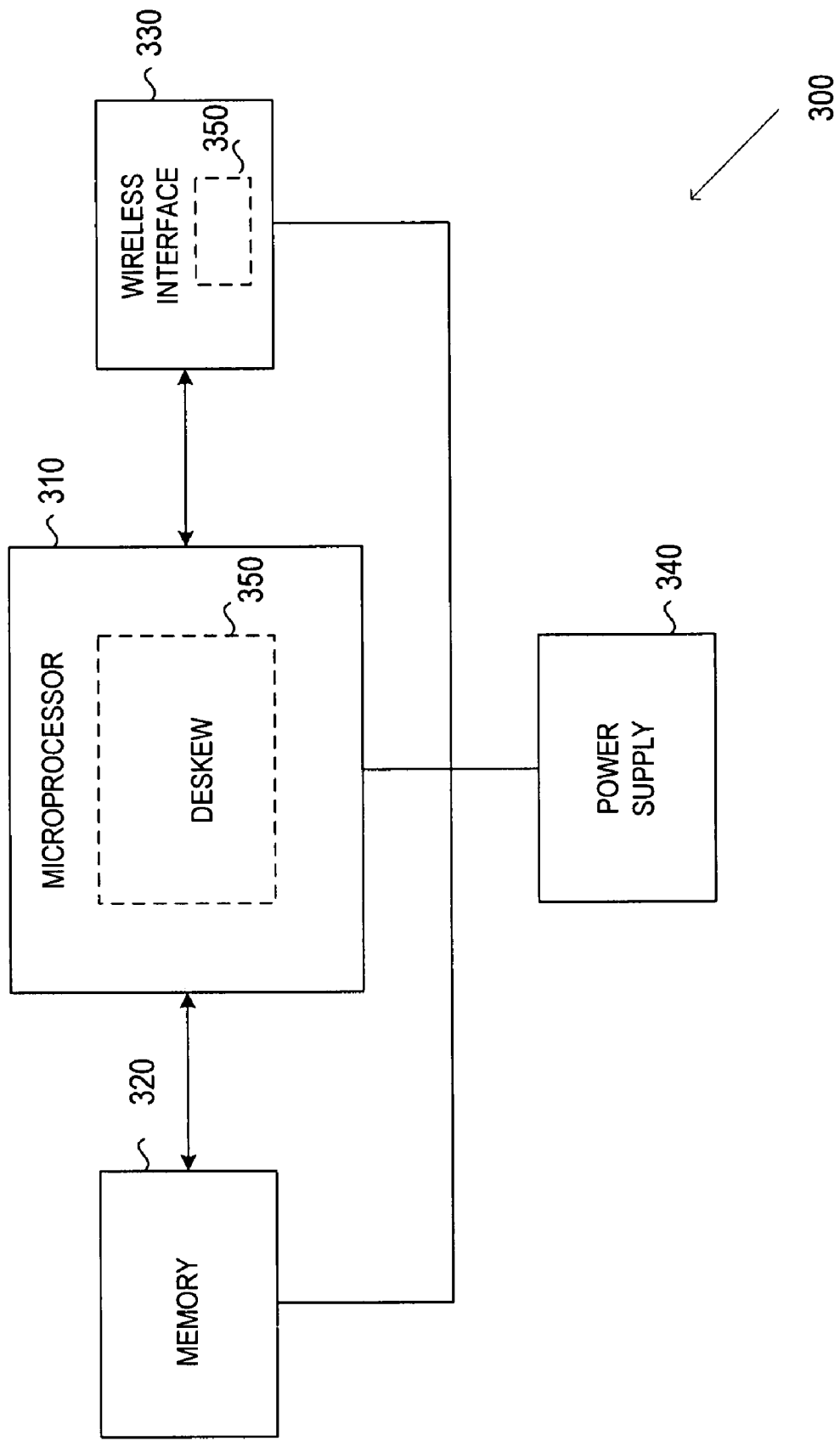
FIG. 3 illustrates an example system utilizing a switched capacitor slew rate detector, according to one embodiment.

FIG. 3 illustrates a wireless system 300 that includes a microprocessor 310 to control the system, memory 320 to store date, a wireless interface 330 to provide wireless communications and a power supply 340 to provide power to the other components. The microprocessor 310 or wireless interface 330 may implement a switched capacitor slew-rate detector 350.

Although the disclosure has been illustrated by reference to specific embodiments, it will be apparent that the disclosure is not limited thereto as various changes and modifications may be made thereto without departing from the scope. Reference to "one embodiment" or "an embodiment" means that a particular feature, structure or characteristic described therein is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus comprising
a first switched capacitor comparator to be charged to a first reference voltage and to compare an input signal to the first reference voltage and to generate a first output signal when the input signal reaches the first reference voltage; and
a second switched capacitor comparator to be charged to a second reference voltage and to compare the input signal to the second reference voltage and to generate a second output signal when the input signal reaches the second reference voltage, wherein time between the first output signal and the second output signal corresponds to slew rate of the input signal.

2. The apparatus of claim 1, wherein
the first switched capacitor comparator includes a capacitor that is to be charged to the first reference voltage during a charge phase; and
the second switched capacitor comparator includes a capacitor that is to be charged to the second reference voltage during the charge phase.

3. The apparatus of claim 2, wherein
the first switched capacitor comparator includes a switch to couple the capacitor to the first reference voltage during the charge phase; and
the second switched capacitor comparator includes a switch to couple the capacitor to the second reference voltage during the charge phase.

4. The apparatus of claim 3, wherein the switch in the first and the second switched capacitor comparators is to be closed upon receipt of a high charge signal.

5. The apparatus of claim 2, wherein
the first switched capacitor comparator further includes a switch to provide the input signal to the capacitor during a compare phase; and
the second switched capacitor comparator further includes a switch to provide the input signal to the capacitor during the compare phase.

6. The apparatus of claim 5, wherein the switch in the first and the second switched capacitor comparators is to be closed upon receipt of a high compare signal.

7. The apparatus of claim 5, wherein
the first switched capacitor comparator is to generate the first output signal when the input signal reaches voltage level stored on the capacitor; and
the second switched capacitor comparator is to generate the second output signal when the input signal reaches voltage level stored on the capacitor.

8. The apparatus of claim 1, wherein the first and the second switched capacitor comparators are to receive two complementary clock signals, wherein the two complementary clock signals are to control when the first and the second switched capacitor comparators are in a charge phase or a compare phase.

9. The apparatus of claim 1, wherein the first and the second switched capacitor comparators are substantially identical.

10. The apparatus of claim 1, in combination with an energy cell to power the apparatus.

11. An apparatus comprising
a first switched capacitor comparator to be charged to a first reference voltage and to compare an input signal to the first reference voltage and to generate a first output signal when the input signal reaches the first reference voltage, wherein the first switched capacitor comparator includes a capacitor that is to be charged to the first reference voltage during a charge phase, and an inverting comparator and a switch to short the inverting comparator input and output together during the charge phase; and
a second switched capacitor comparator to be charged to a second reference voltage and to compare the input signal to the second reference voltage and to generate a second output signal when the input signal reaches the second reference voltage, wherein the second switched capacitor comparator includes a capacitor that is to be charged to the second reference voltage during the charge phase and an inverting comparator and a switch to short the inverting comparator input and output together during the charge phase, and wherein time between the first output signal and the second output signal corresponds to slew rate of the input signal.

12. An apparatus comprising a pair of switched capacitor comparators, wherein the pair of switched capacitor comparators are to receive two complementary clock signals, wherein the two complementary clock signals are to control when the pair of switched capacitor comparators are in a charge phase or a compare phase, wherein
a first one of the pair of switched capacitor comparators are to be charged to a first reference voltage during the charge phase;
a second one of the pair of switched capacitor comparators are to be charged to a second reference voltage during the charge phase;
the first one of the pair of switched capacitor comparators are to compare an input signal to the first reference voltage and to generate a first output signal when the input signal reaches the first reference voltage during the compare phase; and
the second one of the pair of switched capacitor comparators are to compare the input signal to the second reference voltage and to generate a second output signal when the input signal reaches the second reference voltage during the compare phase.

13. The apparatus of claim 12, wherein time between the first output signal and the second output signal corresponds to slew rate of the input signal.

14. The apparatus of 12, wherein the pair of switched capacitor comparators include a charge switch, a compare switch and a capacitor, wherein the charge switches are to be closed and the compare switches are to be open during the charge phase, and wherein the charge switches are open and the compare switches are closed during the compare phase.

15. The apparatus of claim 12, wherein the pair of switched capacitor comparators are substantially identical.

* * * * *